(12) United States Patent
Liu

(10) Patent No.: US 6,522,662 B1
(45) Date of Patent: Feb. 18, 2003

(54) METHOD AND APPARATUS FOR PROVIDING A 10BASE-T COMPATIBLE HOME NETWORK OVER A SINGLE TWISTED-PAIR PHONE LINE

(75) Inventor: Ce Richard Liu, Sugarland, TX (US)

(73) Assignee: Compaq Information Technologies Group, L.P., Houston, TX (US)

(*) Notice: Subject to any disclaimer, the term of this patent is extended or adjusted under 35 U.S.C. 154(b) by 0 days.

(21) Appl. No.: 09/182,922

(22) Filed: Oct. 30, 1998

(51) Int. Cl.[7] ............................. H04J 3/16; H04J 3/22
(52) U.S. Cl. ...................................... 370/465; 375/244
(58) Field of Search ............................. 370/378, 379, 370/282, 283, 284, 461, 462, 463, 465; 375/219, 220, 244

(56) References Cited

U.S. PATENT DOCUMENTS

| | | | |
|---|---|---|---|
| 4,606,051 A | 8/1986 | Crabtree et al. | 375/86 |
| 5,347,225 A | 9/1994 | Graham | 324/523 |
| 5,365,515 A | 11/1994 | Graham | 370/17 |
| 5,379,005 A | 1/1995 | Aden et al. | 333/24 |
| 5,410,754 A * | 4/1995 | Klotzbach et al. | 370/85.13 |
| 5,422,919 A | 6/1995 | Graham | 375/200 |
| 5,450,594 A | 9/1995 | Aden et al. | 395/200.06 |
| 5,467,061 A | 11/1995 | Aden et al. | 333/24 R |
| 5,550,506 A | 8/1996 | Tsumura | 329/304 |
| 5,587,692 A | 12/1996 | Graham et al. | 333/12 |
| 5,696,790 A | 12/1997 | Graham et al. | 375/238 |
| 5,978,373 A * | 11/1999 | Hoff et al. | 370/392 |
| 5,995,555 A * | 11/1999 | Young | 375/296 |
| 6,130,894 A * | 10/2000 | Ojard | |
| 6,314,102 B1 * | 11/2001 | Czerwiec et al. | 370/395 |

OTHER PUBLICATIONS

Texas Instruments; "Implementing aΠ/4 Shift D–QPSK Baseband Modem Using the TMS320C50"; Sep. 1996; pp. 1–40.

3Com Corp. website, Robyn Aber; "XDSL Supercharges Copper"; Mar. 1997; pp. 1–5.

Tut Systems website; "Simply delivering xDSL . . . connecting the local loop to the campus, the high rise and throughout the home."; website update Nov. 3, 1997; pp. 1–6.

Zona Research, Inc.; "Compaq Hits Homerun with Tut"; Aug. 11, 1998; pp. 1–2.

* cited by examiner

*Primary Examiner*—Alpus H. Hsu
*Assistant Examiner*—Thien D Tran
(74) *Attorney, Agent, or Firm*—Conley, Rose and Tayon, P.C.

(57) ABSTRACT

A device for seamlessly providing 10BASE-T compatible data communications over an ordinary single twisted pair home phone line between multiple computers, between computers and peripherals, and between multiple peripherals. Each component that is to communicate over the home phone line will have a 10BASE-T compatible network interface card (NIC) for interfacing with the device. A transmit/receive switch is used to switch the device between a transmit mode and a receive mode. When signal are being transmitted from a component a Manchester coder decodes signals received from the NIC. A differential converter is used to convert the differential signal received from the NIC to a single signal. A modulator is used to modulate the signal to a RF signal using a modulation scheme such as PSK, QPSK, QAM or MCM schemes. A filter is used to limit the bandwidth of the modulated signal and a driver is used to amplify the signal to match the impedance of the phone line. When the device is receiving signal from the phone lines, the signal is filtered with a bandpass filter and amplified with an amplifier. The signal is demodulated with a demodulator using the appropriate demodulation scheme. The demodulated signal is differentially encoded with a differential converter. The Manchester coder will encode the signal and send the signal to the receiving NIC.

6 Claims, 2 Drawing Sheets

METHOD AND APPARATUS FOR PROVIDING A 10BASE-T COMPATIBLE HOME NETWORK OVER A SINGLE TWISTED-PAIR PHONE LINE

FIELD OF THE INVENTION

The present invention relates to home network computer systems, and more particularly, but not by way of limitation, to a method and apparatus for providing 10Base-T Ethernet compatible data communications between computers and peripherals over an ordinary single twisted pair phone line without conflicting with other signals, such as POTS and xDSL signals, being transmitted over the same single twisted pair phone lines.

BACKGROUND OF THE INVENTION

As more appliances and items in the home become computer controlled and as more homes obtain multiple computer systems, such as one for the "home office" and one for the family, the importance of having a home network system to allow data communications between the various computer systems and peripherals within a home is ever increasing.

Baseband Ethernet technology is currently being used by many businesses for data interconnection between computers. One common widely used baseband ethernet technology being used is the 10BASE-T network. The 10BASE-T network has an operating rate of 10 Mbps, utilizes CSMA/CD access protocol, baseband signaling and Manchester data encoding.

A standard 10BASE-T network interface card (NIC) is typically used in the construction of a 10 Mbps Ethernet LANs utilizing unshielded twisted-pair wire. Under the 10BASE-T standard, workstations are cabled using twisted-pair wire (one twisted pair for transmission and one twisted pair for reception) to medium access units (MAUs). Each MAU normally has a builtin attachment interface unit (AIU) that can be cabled to a coaxial transceiver attached to coaxial cable.

However, because home phone lines are traditionally considered to be narrow band and therefore only permit low data rate signals, bringing Ethernet to the home environment would require new wiring in virtually every home.

Some proposed solutions to home networking include standard modem technology and digital subscriber line (xDSL) technology. One of the problems with standard modem technology is that it is currently limited to data speeds of 56 kbps and requires very complicated circuitry. Although, xDSL technology can transmit data at a much higher rate that standard modem technology, up to 4 Mbps, the cost of implementing such is very high and requires very complicated modulation methods.

Another proposed solution is the wireless solution. Wireless solutions would also be very expensive to implement and do not have the reliability of a wired solution.

One existing home network product is that of TUT Systems, the HR1300T. The HR1300T uses a "time modulation line code" to provide an in-home network over existing phone lines. However, this modulation scheme only provides a slow 1.3 Mbps data rate.

Therefore, as can be appreciated, there is a need to provide an easy-to-install-and-use, low cost home networking solution that can provide high data rates.

SUMMARY OF THE INVENTION

The present invention overcomes the above identified problems as well as other shortcomings and deficiencies of existing technologies by providing a method and apparatus that enables seamless 10Base-T Ethernet compatible data communications between computers and peripherals over an ordinary single twisted pair phone line without conflicting with other signals, such as POTS and xDSL signals, being transmitted over the same single twisted pair phone lines.

The present invention further provides a device for seamlessly providing 10BASE-T compatible data communications over an ordinary single twisted pair home phone line between multiple computers, between computers and peripherals, and between multiple peripherals. Each component that is to communicate over the home phone line will have a 10BASE-T compatible network interface card (NIC) for interfacing with the device. The device includes a Manchester coder; differential converter; baseband processor; modulator; demodulator; filters; amplifiers, and a transmit/receive switch. The transmit/receive switch is used to switch the device between a transmit mode and a receive mode. When signal are being transmitted from a component the Manchester coder decodes signals received from the NIC. The differential converter is used to convert the differential signal received from the NIC to a single signal. The modulator is used to modulate the signal to a RF signal using a modulation scheme such as one of the PSK, QPSK, QAM or MCM schemes. A filter is used to limit the bandwidth of the modulated signal and a driver is used to amplify the signal to match the impedance of the phone line. When the device is receiving a signal from the phone lines, the signal is filtered with a bandpass filter and amplified with an amplifier. The signal is demodulated using the appropriate demodulation scheme. The demodulated signal is differentially encoded. The Manchester coder will encode the signal and send the signal to the receiving NIC.

BRIEF DESCRIPTION OF THE DRAWINGS

A more complete understanding of the present invention may be had by reference to the following Detailed Description and appended claims when taken in conjunction with the accompanying Drawings wherein:

DETAILED DESCRIPTION

Figure 1:
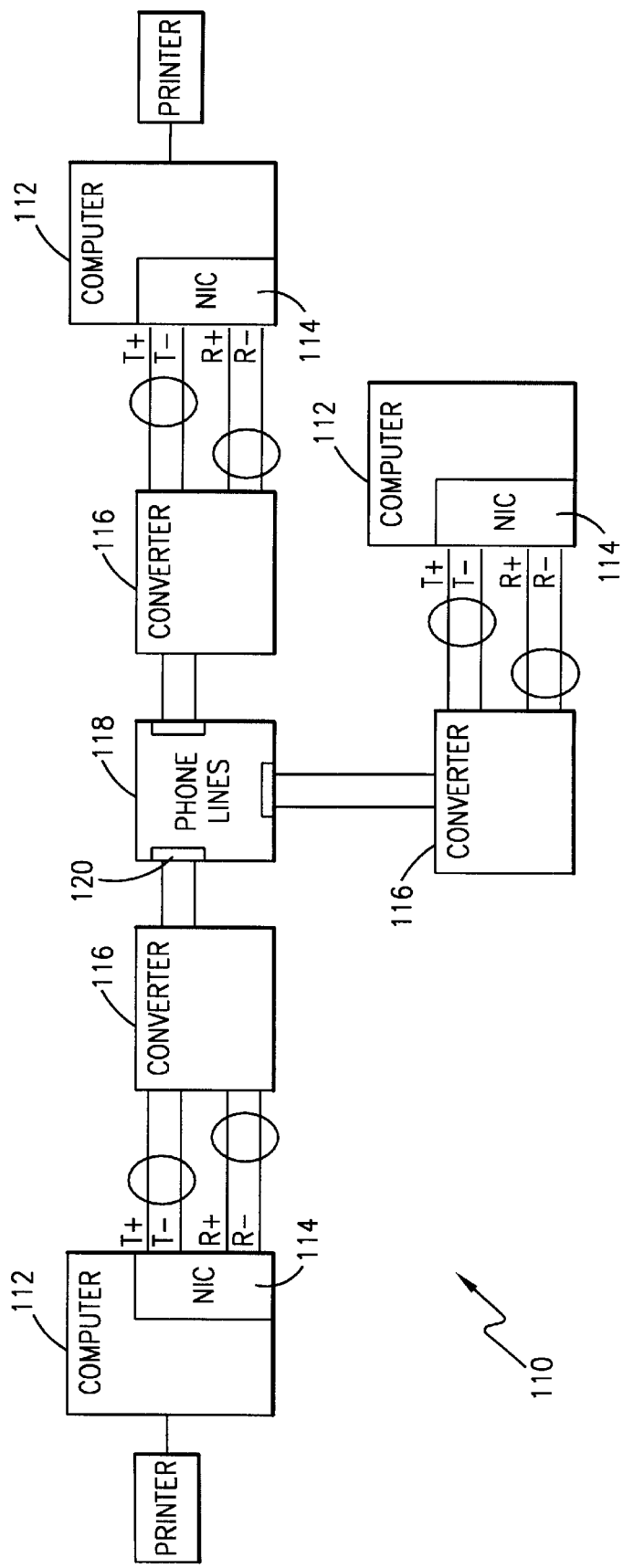
FIG. 1 is a block diagram of an exemplary home utilizing the present invention.

With reference to FIG. 1, there is shown a block diagram of a home 110 in which an exemplary embodiment the present invention is being utilized to provide a high rate data communications between multiple computers and peripherals connected to a single twisted pair of home phone lines.

As depicted in FIG. 1, home 110 includes multiple computers, such as computers 112. Each of the computers includes a network interface card (NIC) 114. The NIC of each computer is connected to a converter, such as converter 116. The converter of each computer is connected to the phone lines 118 of the house through a standard phone jack 120.

In this exemplary embodiment of the present invention, each of the NICs are standard 10BASE-T network interface cards. As can be appreciated, a standard 10BASE-T NIC provides that the data communication received and transmitted therefrom occur over two twisted-pair wires. The first twisted pair is for transmission of data (T+, T−) and the second twisted pair is for receiving data (R+, R−).

Still referring to FIG. 1, the converters 116, which are connected between each of the computers and the phone lines, allow data to be transmitted between each of the computers over the phone lines at a rate of 10 Mbps without a hub. A more detailed description of converter 116 is given hereinbelow with reference to FIG. 2. In this exemplary embodiment of the present invention, it is preferred that the data converters operate seamlessly with respect to each of the computers and the corresponding NICs, i.e., the data communication between each of the computers appears to each of the computers and corresponding NIC to be a 10BASE-T Ethernet LAN.

Figure 2:
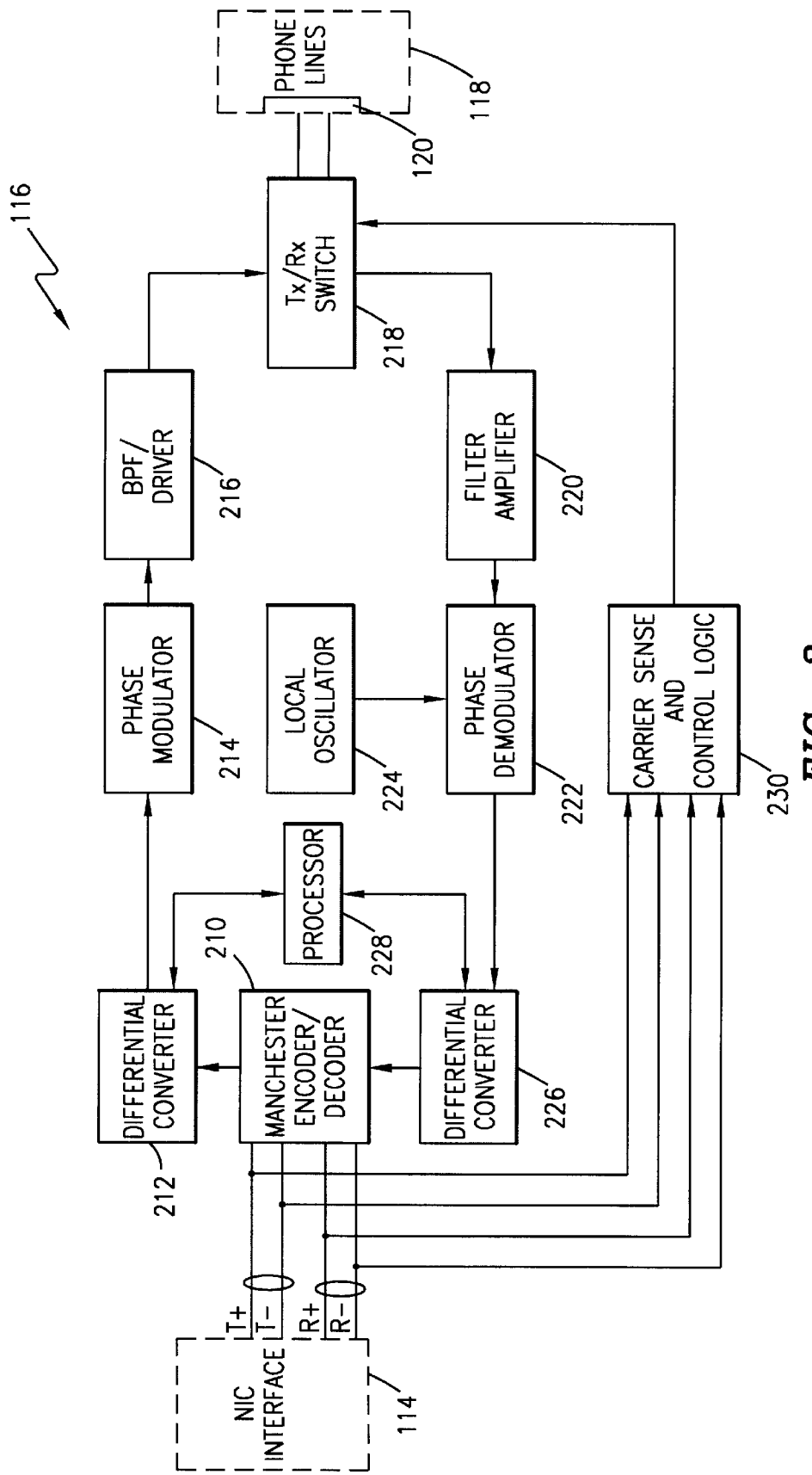
FIG. 2 is a schematic block diagram of an exemplary embodiment of the present invention.

Referring now to FIG. 2, there is illustrated a more detailed exemplary embodiment of a converter 116 as similarly shown in FIG. 1. As depicted, converter 116 includes the following: a Manchester encoder/decoder 210; a differential converter 212; a phase modulator 214, a bandpass filter/driver 216; a transmit/receive switch 218; a filter/amplifier 220; a phase demodulator 222; a local oscillator 224; a differential converter 226; a control processor 228; and carrier and control logic 230.

As depicted, converter 116 is coupled between a NIC 114 and a phone jack 120 of single twisted pair phone lines 118. It is preferred that NIC 114 be a standard 10BASE-T NIC.

Still referring now to FIG. 2, the operation of converter 116 will now be described. Converter 116 is operable in two modes, a transmit mode and a receive mode. The default mode of converter 116 is the receive mode. If a signal is to be transmitted by NIC 114 through converter 116, converter 116 will switch to transmit mode only when there are no signals sensed on the phone lines by carrier sensor and control logic 230. If no signals are sensed on the phone lines, carrier sensor and control logic 230 will switch transmit/receive switch 218 into a transmit position.

As described herein above, the 10BASE-T NIC utilizes two twisted pair of wires, one pair for transmitting differential data signals (T+, T−), and the other pair for receiving differential data signals (R+, R−). When 10BASE-T NIC transmits data, the data is encoded using a Manchester code. Therefore the differential data signals being transmitted from NIC 114 over T+ and T− and received at Manchester encoder/decoder 210 are Manchester encoded differential data signals. Manchester encoder/decoder 210 decodes the differential data received from NIC and sends the signals to the differential convertor 212.

The decoded differential data signals received from Manchester encoder/decoder 210 are then differentially converted by the differential convertor 212, i.e., the differential signal pair are converted into a single data signal.

The single data signal is then sent to phase modulator 214. Phase modulator 214 modulates the signal to a radio frequency (RF) signal using a phase modulation scheme such as differential binary phase shift keying (DBPSK), differential quadrature phase shift keying (DQPSK). Although good results have been achieved with the carrier used in the modulation having a center frequency of 30 MHZ with a frequency range of either 21.2–38.8 MHZ for DBPSK or a frequency range of 25.6–34.4 MHZ for DQPSK, it is contemplated that the present invention is not limited to these center frequencies or these frequency ranges. These modulation schemes and frequencies allow the data to be communicated over the phone lines without being interfered with or interfering with other POTS and xDSL signals also being transmitted over the phone lines.

Although the present invention utilizes phase modulation, it is contemplated that other types of modulation schemes could also used such as, but not limited to, multicarrier modulation (MCM) and quadrature amplitude modulation (QAM). It is also contemplated that the modulation process can be analog or digital, depending on the implementation.

The modulated data signal is then sent to bandpass filter/driver 216 where the modulated data signal is filtered with a bandpass filter to limit the bandwidth of the data signal and is also amplified by a line driver to match the impedance of the phone line. The data signal is then sent through switch 218 to phone lines 118.

When carrier sense and control logic 230 detects that NIC 114 if finished transmitting data signal or that there are no signals sensed on the phone lines, carrier sense and control logic 230 will switch Tx/Rx switch 218 back to the receive mode, the default mode.

When receiving modulated data signals from the phone lines 118, the modulated signal is bandpass filtered and amplified by filter/amplifier 220. The filtered signal is then demodulated by phase demodulator 220 using the corresponding demodulation scheme. The demodulated signal is then differentially converted with differential converter 226 from a single signal to differential signal pair. The differential signal pair is then encoded with Manchester encoder 210 and sent to NIC 114 over R+ and R−.

As described hereinabove, carrier sense and control logic 230 is used to switch Tx/Rx switch 218 between transmit and receive. The signals from NIC 114 are used to determine if whether or not NIC 114 wants to "talk" or not. If NIC 114 wants to "talk", carrier sense and control logic 230 must determine if the phone lines are available. It does this using standard Ethernet Carrier Sense Multiple Access/Collision Detection (CSMA/CD) scheme.

Baseband processor 228 primarily controls three functions, the differential decoding and encoding performed by differential converters 212 and 226 as well as clock recovery with local oscillator 224. In the "transmitting path" when data signals are being sent from NIC 114 through converter 116 as described hereinabove, they will have known clock information which is recovered with local oscillator 224.

Those skilled in the art can realize that the teachings of the present invention as described hereinabove provides a method and apparatus that enables 10Base-T Ethernet compatible data communications between computers and peripherals over an ordinary single twisted pair phone line without conflicting with other signals, such as POTS and xDSL signals, being transmitted over the same single twisted pair phone lines.

It can be further appreciated that the present invention provides a device for seamlessly providing 10BASE-T compatible data communications over an ordinary single twisted pair home phone line between multiple computers, between computers and peripherals, and between multiple peripherals. A transmit/receive switch is used to switch the device between a transmit mode and a receive mode. When data signals are being transmitted from a component, a Manchester coder decodes signals received from the NIC. A differential converter is used to convert the differential signal received from the NIC to a single signal. A modulator is used to modulate the signal to a RF signal using a modulation scheme such as PSK, QPSK, QAM or MCM schemes. A filter is used to limit the bandwidth of the modulated signal and a driver is used to amplify the signal to match the impedance of the phone line. When the device is receiving signal from the phone lines, the signal is filtered with a bandpass filter and amplified with an amplifier. The signal is demodulated with a demodulator using the appropriate demodulation scheme. The demodulated signal is differentially encoded with a differential converter. The Manchester coder will encode the signal and send the signal to the receiving NIC of a component.

Although a preferred embodiment of the present invention has been illustrated in the accompanying Drawings and described in the foregoing Detailed Description, it will be understood that the invention is not limited to the embodiment disclosed, but is capable of numerous rearrangements, modifications and substitutions without departing from the spirit of the invention as set forth and defined by the following claims.

What is claimed is:

1. A converter unit which converts differential signals from a network interface card (NIC) associated with a first device to single data signals to be provided over a two-wire telephone line to a second device, comprising:

an encoder/decoder coupled to said NIC and transmitting and receiving said differential signals, said encoder/decoder decoding said differential signals received from said NIC and encoding said differential signals provided to said NIC;

an electronic switch coupled to said two-wire telephone line, said single data signals being transmitted through said switch to the telephone line and received from said telephone line;

a first differential converter coupled to said encoder/decoder and said electronic switch, said first differential converter receives said decoded differential signals from said encoder/decoder and converts said differential signals to single data signals;

a modulator coupled to said first differential converter and receiving said single data signals from said first differential converter, said modulator using a carrier signal having a frequency to modulate said single data signals and provide said modulated single data signals to said switch;

a second differential converter coupled to said encoder/decoder and said electronic switch, said second differential converter receives said decoded single data signals from said switch and converts said single data signals to differential signals and provides said differential data signals to said encoder/decoder where said differential data signals are encoded and provided to said NIC; and carrier sense and control logic coupled to said electronic switch;

wherein a plurality of other devices that are incompatible with said first and second devices communicate with one another over said two-wire telephone line;

wherein said carrier sense and control logic determines whether said two-wire telephone line is available for said converter unit to transmit said single data signals to said second device over said telephone line; and wherein said carrier frequency used to modulate said single data signals is different than frequencies associated with signals transmitted between said plurality of other devices.

2. The converter unit of claim 1 further including a demodulator coupled to said electronic switch and said second differential converter, said demodulator receives modulated single data signals from said switch, demodulates said modulated single data signals and provides said demodulated signals to said second differential converter.

3. The converter unit of claim 1 wherein said carrier sense and control logic uses a carrier sense multiple access/collision detection (CSMA/CD) to determine whether said two-wire telephone line is available for said converter unit to transmit said single data signals to said second device over said telephone line.

4. The converter unit of claim 1 wherein said other devices that communicate over said two-wire telephone line include telephones and computers.

5. A home network, comprising:

a plurality of devices, each having a network interface controller (NIC);

a plurality of telephones;

two-wire telephone lines running through a home connected to said plurality of devices and telephones;

a plurality of converter units, one converter unit connected to each device, said converter unit comprising:

an encoder/decoder coupled to the NIC of a device and transmitting and receiving differential signals to and from said device, said encoder/decoder decoding said differential signals received from said NIC and encoding said differential signals transmitted to said NIC;

an electronic switch coupled to said two-wire telephone line, single data signals being transmitted through said switch to the telephone line and received from said telephone line;

a first differential converter coupled to said encoder/decoder and said electronic switch, said first differential converter receives said decoded differential signals from said encoder/decoder and converts said differential signals to single data signals;

a modulator coupled to said first differential converter and receiving said single data signals from said first differential converter, said modulator using a carrier signal having a frequency to modulate said single data signals and provide said modulated single data signals to said switch;

a second differential converter coupled to said encoder/decoder and said electronic switch, said second differential converter receives said decoded single data signals from said switch and converts said single data signals to differential signals and provides said differential data signals to said encoder/decoder where said differential data signals are encoded and provided to said NIC; and carrier sense and control logic coupled to said electronic switch;

wherein said carrier sense and control logic determines whether said two-wire telephone line is available for said converter unit to transmit said single data signals to another of said devices over said telephone line; and wherein said carrier frequency used to modulate said single data signals is different than frequencies associated with voice signals to and from said telephones.

6. The home network of claim 4 wherein said carrier sense and control logic uses a carrier sense multiple access/collision detection (CSMA/CD) to determine whether said two-wire telephone line is available for said converter unit to transmit said single data signals to another device over said telephone line.

* * * * *